US009281616B2

(12) United States Patent
Ohnuki et al.

(10) Patent No.: US 9,281,616 B2
(45) Date of Patent: Mar. 8, 2016

(54) CONNECTOR

(71) Applicant: SOURIAU JAPAN K.K., Kawasaki-shi (JP)

(72) Inventors: Shigeru Ohnuki, Kawasaki (JP); Kazuo Enomoto, Kawasaki (JP)

(73) Assignee: SOURIAU JAPAN K.K., Kawasaki-shi (JP)

( * ) Notice: Subject to any disclaimer, the term of this patent is extended or adjusted under 35 U.S.C. 154(b) by 22 days.

(21) Appl. No.: 14/351,025

(22) PCT Filed: Oct. 5, 2012

(86) PCT No.: PCT/JP2012/076008
§ 371 (c)(1),
(2) Date: Apr. 10, 2014

(87) PCT Pub. No.: WO2013/054767
PCT Pub. Date: Apr. 18, 2013

(65) Prior Publication Data
US 2014/0295686 A1 Oct. 2, 2014

(30) Foreign Application Priority Data

Oct. 11, 2011 (JP) ................................. 2011-224392

(51) Int. Cl.
*H01R 12/57* (2011.01)
*H01R 13/629* (2006.01)
(Continued)

(52) U.S. Cl.
CPC ...... *H01R 13/62938* (2013.01); *H01R 12/7005* (2013.01); *H01R 12/724* (2013.01); *H01R 13/62983* (2013.01); *H05K 7/1409* (2013.01)

(58) Field of Classification Search
CPC ...... H01R 13/633; H01R 12/57; H01R 12/72; H01R 13/62988
See application file for complete search history.

(56) References Cited

U.S. PATENT DOCUMENTS 4,178,051 A * 12/1979 Kocher et al. ................. 439/157
4,602,835 A * 7/1986 Bauer et al. ................... 439/160
(Continued)

FOREIGN PATENT DOCUMENTS

JP 58-12983 U 1/1983
JP 64-12784 U 1/1989
(Continued)

OTHER PUBLICATIONS

Extended Search Report issued Apr. 9, 2015 in European Patent Application No. 12839751.0.
(Continued)

*Primary Examiner* — Truc Nguyen
(74) *Attorney, Agent, or Firm* — Oblon, McClelland, Maier & Neustadt, L.L.P.

(57) ABSTRACT

A connector mounted to a circuit board to be inserted into a storage destination, and configured to include: a connector body including a housing part for housing an electric terminal connected to a predetermined wire of the circuit board, and a base part connected to the housing part; a panel including an opening which is formed in a pair of opposed surfaces and through which the housing part can be inserted; an ejector for detaching the circuit board from an insertion destination by turning; and a connection member connected to a turning shaft part for turning the ejector to fasten the circuit board and the base part of the connector body. The connector can be mounted, together with the ejector, to a compact circuit board corresponding to a compact unit wire rack and can be efficiently mounted in a saved space.

8 Claims, 6 Drawing Sheets

(51) Int. Cl.
*H01R 12/70* (2011.01)
*H01R 12/72* (2011.01)
*H05K 7/14* (2006.01)

(56) References Cited

U.S. PATENT DOCUMENTS

| | | | |
|---|---|---|---|
| 4,789,352 A * | 12/1988 | Kreinberg et al. | 439/260 |
| 4,875,867 A * | 10/1989 | Hoo | 439/157 |
| 4,996,631 A * | 2/1991 | Freehauf | 361/798 |
| 5,389,000 A | 2/1995 | DiViesti et al. | |
| 5,669,512 A | 9/1997 | Joslin | |
| 5,810,613 A | 9/1998 | Ati et al. | |
| 5,989,043 A | 11/1999 | Han et al. | |
| 6,190,204 B1 | 2/2001 | Huang | |
| 6,361,335 B1 * | 3/2002 | Calanni et al. | 439/152 |
| 6,419,499 B1 * | 7/2002 | Bundza | 439/61 |
| 6,955,550 B2 * | 10/2005 | Schlack | 439/160 |
| 6,957,979 B2 * | 10/2005 | Welsh et al. | 439/565 |
| 7,264,490 B1 * | 9/2007 | Reznikov | 439/152 |
| 7,292,457 B2 * | 11/2007 | DeNies et al. | 361/801 |
| 2010/0255693 A1 | 10/2010 | Brown et al. | |

FOREIGN PATENT DOCUMENTS

| | | |
|---|---|---|
| JP | 3-101590 U | 10/1991 |
| JP | 4-79489 U | 7/1992 |
| JP | 11-135969 A | 5/1999 |
| JP | 2006-114357 A | 4/2006 |

OTHER PUBLICATIONS

International Search Report issued Dec. 4, 2012 in PCT/JP2012/076008 with English language translation.

* cited by examiner (a)    (b)

US 9,281,616 B2

CONNECTOR

TECHNICAL FIELD

The present invention relates to a connector for connecting an electrical circuit board of the type inserted in a unit wiring rack (subrack) or the like, the connector being mounted on a panel for sealing the insertion port of the unit wiring rack.

BACKGROUND ART

In recent years, the unit wiring racks used in computer systems have circuit boards mounted by insertion into the unit wiring rack with a panel as a lid. In this case, the input and output of electrical signals may be performed via a connector mounted on the panel and connected to the circuit board (front panel type).

FIG. 13 shows a plurality of panel circuit boards comprising a panel and a connector mounted on a circuit board, inserted into a unit wiring rack. When the storage space in the unit wiring rack is sufficiently large as shown in FIG. 13, large circuit boards can be used. In that case, because conventional circuit boards are large and the edges are long enough in the longitudinal direction of the panels, they were able to be assembled with the connecting portion between the ejector and the circuit board and the connecting portion between the connector and the substrate provided separately.

However, there is a demand for reducing the size of devices in the industry, and the miniaturization of unit wiring racks has led to a need for miniaturization of panel circuit boards as well. Since unit wiring racks and circuit boards are standardized, if the conventional connector terminal sizes and inter-terminal distance are used, there will be extremely limited space on the edges of the circuit boards on which the connectors are mounted, requiring the number of electrical terminals to be decreased. For this reason, it is desirable to be able to support more electrical terminals in the limited space on the edges of the circuit boards.

FIG. 14 is an exploded perspective view of a circuit board assembly showing a method for attaching a connector of the same type as that shown in FIG. 13 to a small circuit board using conventional art.

The panel circuit board 51 shown in FIG. 14 comprises a connector body 53 having a housing portion 513 for housing electrical terminals 52 for connection to predetermined wires on the circuit board 55, and a base portion 514 extending from the housing portion 513 and connected to the circuit board 55. Additionally, the panel circuit board 51 is constructed so that a panel 57 having an aperture portion 58 for passing the housing portion 513 and a frame body 518 having an aperture portion 58' for passing the housing portion 513 and covering the housing portion 513 are attached as separate elements to the connector body 53 by means of predetermined screws, and to a cuboid block 511 to which an ejector 56 is attached.

The circuit board 55 and connector body 53 are attached by passing a pair of screws 520 (FIG. 14 shows only one of the screws) through a pair of through holes (not shown) provided in the circuit board 55 and a pair of through holes 526 (shown in FIG. 11) provided in the base portion 514, then fastening them with nuts or the like.

Additionally, the attachment between the ejector 56 and the circuit board 55 is achieved by passing a cam portion 529 of an ejector 56 through an aperture portion 59 in the front panel 57, aligning a turn axis hole 523 on the cam portion 529 with a through hole 524 in the cuboid block 511 and a through hole in the circuit board 55 (not shown), inserting a screw 521 into the connecting holes and fastening with a nut or the like. A tubular sleeve forming a spacer, not shown, is disposed between the cuboid block 511 and the nut, and the screw 521 is passed therein, so the ejector 56 is capable of turning.

As described above, conventional panel circuit boards 51 have a structure provided with two adjacent attachment portions, i.e. an attachment portion for attaching the circuit board 55 to the connector body 53, and an attachment portion for attaching the ejector 56 to the circuit board 55. They therefore make inefficient use of the space at the edges of the circuit board onto which a connector is to be mounted, and have a complicated mounting structure using many components.

Additionally, there has been a demand in the industry to support as many electrical terminals as possible in the limited space at the edges of circuit boards, while retaining the size and spacing of conventional electrical terminals.

RELATED ART DOCUMENTS

Patent Documents

Patent Document 1: JP 2006-114357 A

SUMMARY OF THE INVENTION

Problems to be Solved by the Invention

The present invention was made in consideration of the above-described problems, and has the purpose of offering a novel connector capable of being effectively assembled in limited space by passing a turn axis member of an ejector through the ejector and the circuit board in order to attach the circuit board and the connector body.

Means for Solving the Problems (1) In order to solve the above-mentioned problems, the present invention offers a connector to be attached to a circuit board inserted into a receptacle, the connector comprising a connector body having a housing portion for housing electrical terminals connected to predetermined wires in the circuit board, and a base portion next to the housing portion; a panel having an aperture portion formed inside a pair of opposing surfaces, through which the housing portion can be passed; an ejector for ejecting said circuit board from an insertion state by turning; and a connecting member connected to the turn axis portion for turning the ejector so as to secure the circuit board and the connector body.

(2) Additionally, the connecting member of the connector according to the present invention should preferably be integrally molded with the panel using a conductive material.

(3) Additionally, the connector according to the present invention preferably further comprises a frame covering at least a portion of the housing portion of said connector body, wherein the frame, the panel and the connecting member are electrically connected to at least one wire of the circuit board through the turn axis portion.

(4) Additionally, the connecting member of the connector according to the present invention should preferably be integrally molded with the base portion of the connector body.

(5) Additionally, the connecting member of the connector according to the present invention should preferably comprise a connecting portion with the frame.

Effects of the Invention (1) The connector according to the present invention comprises a connecting member connected to a turn axis portion for turning the ejector so as to secure the circuit board and the base portion of the connector body, enabling the base portion of the connector body and the ejector to be assembled integrally, so that the space for attaching the ejector and the circuit board in a conventional connector can be eliminated, as a result of which the number of electrical terminals in the connector can be maintained and complicated circuit arrangements can be supported.

(2) The connector according to the present invention has a connecting member that is integrally molded with the panel using a conductive material, so that the number of components can be reduced and the connector can be easily assembled, in addition to the fact that, for example, the frame ground of the unit wiring rack can be connected to a ground line of the circuit board via the panel, the connecting member and the conductive turn axis portion of the ejector, as a result of which a shielding effect can be achieved with respect to the electrical terminals of the connector.

(3) The connector according to the present invention has the frame, the panel and the connecting member connected to at least one wire in the circuit board through the turn axis portion, so for example, the conductive frame of a counterpart connector connected to a ground line can be electrically connected to the frame of the connector according to the present invention connected to the ground line of the circuit board, as a result of which an electrically stable connector can be offered.

(4) The connector according to the present invention has a connecting member integrally molded with the base portion of the connector body, enabling the connecting member to be eliminated, thereby reducing the number of components and making assembly of the connector easier.

(5) The connector according to the present invention has a connecting member further comprising a connecting portion with the frame, enabling connecting components such as screws or bolts to be connected from different directions with a single connecting member, as a result of which a small connector that can be easily assembled and achieving the purpose of the present invention can be offered.

BRIEF DESCRIPTION OF THE DRAWINGS

FIG. 7 An enlarged side view showing the details of the screw 11 and screw 24 in FIG. 3 being screwed in.

MODES FOR CARRYING OUT THE INVENTION

Figure 1:
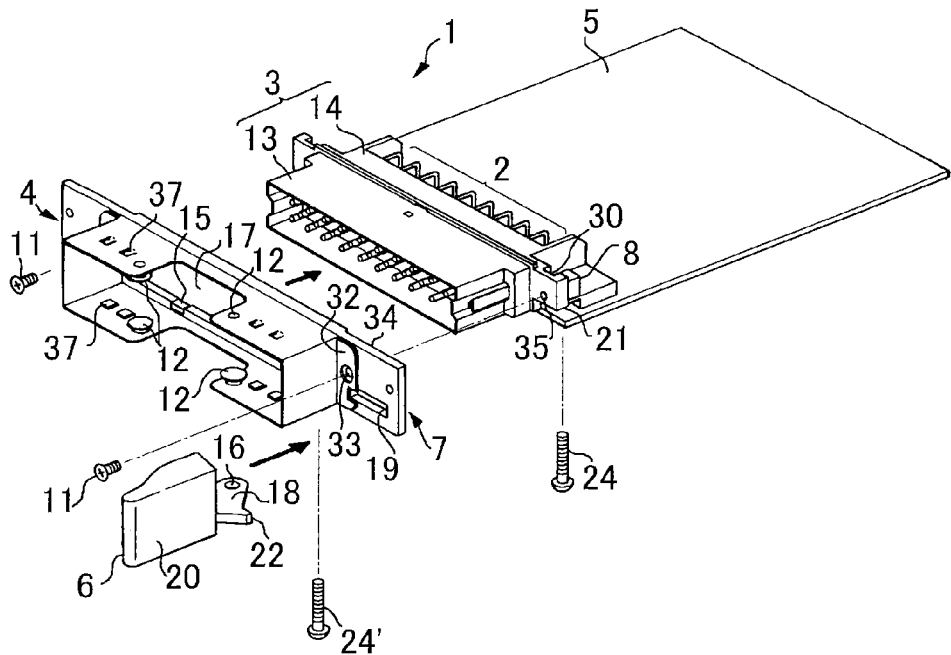
FIG. 1 An exploded perspective view of a panel circuit board according to the present invention.

Preferable embodiments of the present invention will be explained by giving examples with reference to the drawings. The same elements in the drawings will be numbered using the same reference numbers, and their explanations may be omitted. Herebelow, a circuit board having an edge portion with a connector and a panel for a rack wiring unit shall be referred to as a panel circuit board.

Embodiment 1

FIG. 1 is an exploded perspective view of the panel circuit board 1 of the present invention which is to be inserted into a unit wiring rack or the like for storage.

Figure 2:
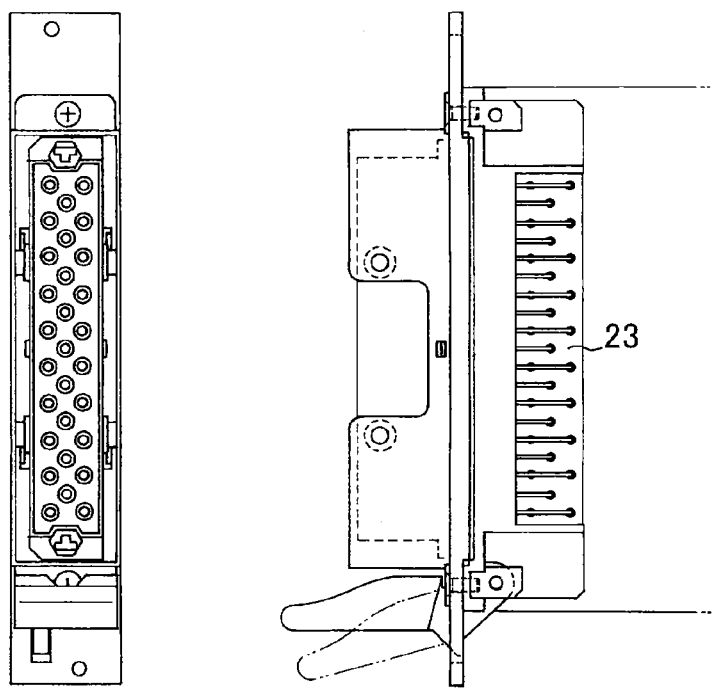
FIG. 2(*a*) An assembled front view of a panel circuit board according to the present invention. (*b*) An assembled plan view of a panel circuit board according to the present invention.

FIG. 2(*a*) is a front view with the assembly of the panel circuit board 1 shown in FIG. 1 completed, and FIG. 2(*b*) is a plan view.

Figure 3:
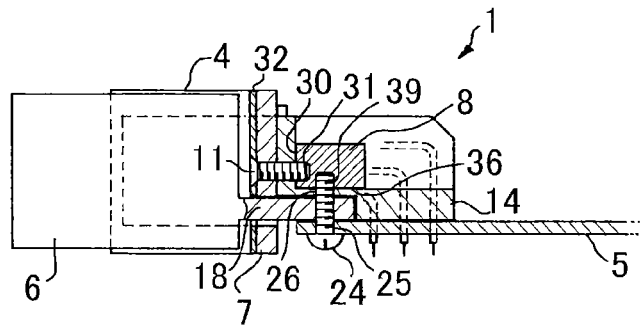
FIG. 3 A side view of the panel circuit board 1 of FIG. 1 from the ejector side, showing Embodiment 1 and Embodiment 2 of the panel circuit board according to the present invention.

FIG. 3 is a side view from the ejector side of the panel circuit board 1 of FIG. 1 corresponding to Embodiment 1 and Embodiment 2, showing the connection arrangement between the frame 4, panel 7, cuboid block 8 and base portion 14 of the connector body 3.

Figure 7:
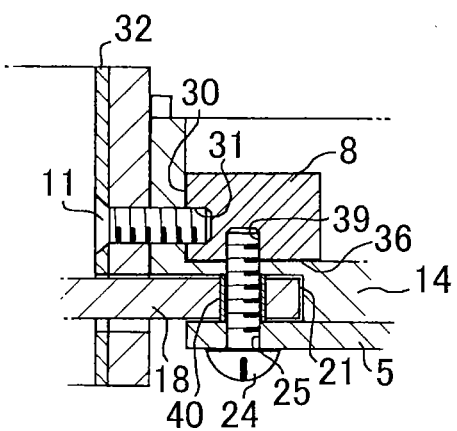

FIG. 7 is an enlarged side view showing the details of a screw 11 and screw 24 screwed into the cuboid block 8 in FIG. 3.

Figure 13:
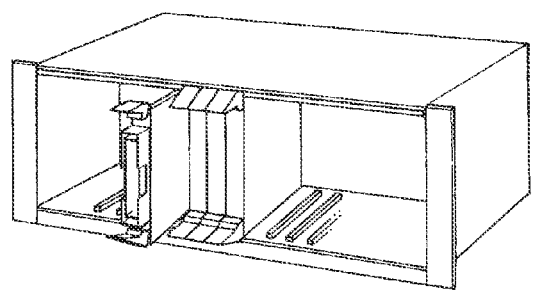
FIG. 13 A diagram showing a panel circuit board having a panel and connector mounted on a circuit board inserted into a unit wiring rack.
Figure 14:
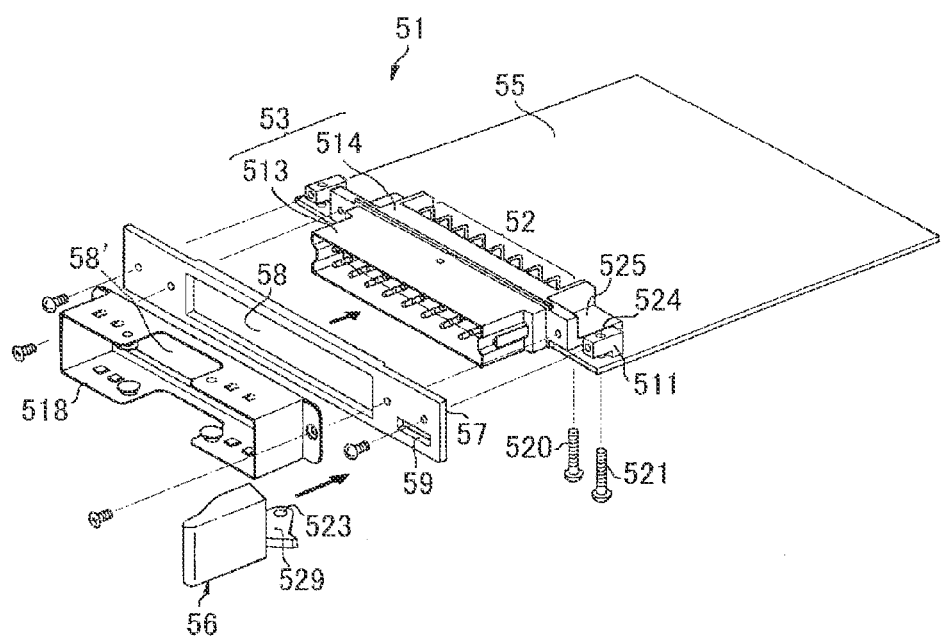
FIG. 14 An exploded perspective view of a panel circuit board showing a method of attachment to a small circuit board of a connector of the same shape as that shown in FIG. 13 using the conventional art.

A unit wiring rack is used for housing computer equipment and communications equipment, and as shown in FIG. 13, enables simultaneous insertion of a plurality of substrates in order to make efficient use of circuit wiring space.

A panel circuit board 1 comprises a circuit board 5, a connector body 3 for housing an electrical terminal 2 connected to circuitry (not shown) of the circuit board 5, a panel 7 for sealing the insertion port of the unit wiring rack, a conductive frame 4 mounted on the panel 7, an ejector 6 enabling the panel circuit board 1 to be removed from the unit wiring rack by turning, and a cuboid block 8.

The connector body 3 comprises a housing portion 13 for housing an electrical terminal 2, and a base portion 14 next to the connector body 3, and is formed, for example, by integral molding with a resin or the like having thermoplasticity. The base portion, as explained below, has two through holes, i.e. a through hole 35 penetrated by the screw 11 together with the frame 4 and the panel 7, and a through hole 25 penetrated by the screw 24 together with the circuit board 5 (see FIG. 3).

The frame 4 is formed so as to cover at least a part of the housing portion 13, has four protrusions 12 projecting from the opposing surfaces thereof in the direction of the housing portion 13, and these protrusions 12 have the function of moving the connector in a plug-in direction by turning a lever provided on a counterpart connector. Additionally, the frame 4 has four raised portions 37 that are raised in the direction of projection of the protrusions 12 from the surface on which the four protrusions 12 are provided.

Additionally, the frame 4 is provided with a tab 32 that is penetrated by the screw 11 together with the panel 7 and the base portion 14 of the connector body 3. Furthermore, the frame 4 has an aperture portion 17 through which the housing portion 13 of the connector body 3 can be passed, so that when the panel circuit board 1 is to be assembled, the housing portion 13 is inserted from the aperture portion 17, and at least a portion of the housing portion 13 is covered inside the framework of the frame 4.

Furthermore, the frame 4 has a claw portion 15 projecting from an edge of the aperture portion 17, and the claw portion 15 is press-fitted near the edge of the aperture portion of the panel so as to be inserted into the space between the housing portion 13 of the connector body 3 and the frame 4, enabling the frame 4 and the panel 7 to be fixed together before assembly of the panel circuit board 1.

The panel 7 is composed of a conductive plate-shaped member, and has an aperture portion with the same profile as the aperture portion 17 of the frame 4 enabling passage in the thickness direction of the housing portion 13 of the connector body 3.

The ejector 6 is composed of a turning knob portion 20 and a cam portion 18 having a turn axis hole 16 for passing a tubular sleeve 40 enabling passage of a screw 24 forming the turn axis. The cam portion 18 is passed through the aperture portion 19 of the panel 7 and inserted into a space portion 21 between the circuit board 5 and a part of the base portion 14 of the connector body 3 formed with reduced thickness near one edge of the circuit board 5. A tubular sleeve 40 having two openings is passed through the turn axis hole 16. Since both ends of the tubular sleeve 40 protrude from the turn axis hole 16, it functions as a spacer for the cam portion 18 to move in the direction of the turn axis inside the space portion 21 (see FIG. 7 for details). Additionally, as described below, when the screw 24 is passed into the tubular sleeve 40, the ejector 6 is enabled to turn about the screw 24 as a turn axis, and upon turning by a predetermined angle, a projection 22 formed on the cam portion 18 abuts an edge portion or the like (not shown) of the unit wiring rack, and after further turning, the panel circuit board 1 is released from the unit wiring rack.

The cuboid block 8 is a connecting member having the function of connecting the screw 11, screw 24 or both, and the present invention covers all connecting members having said function. For example, it may be modified so that the connecting member is a polyhedral block, so that a through hole is formed in the thickness of a flat plate that is threaded and attached by the screw 11 or screw 24 in the hole, or so that the screw 11 or 24 is passed through a through hole penetrating in the thickness direction of the flat plate and secured by a nut. Additionally, it may be modified to a form wherein the plate is formed in an L-shape and the screw 11 and screw 24 are simultaneously connected. Furthermore, a modification is possible to provide no cuboid block 8 as the connecting member, and instead to directly connect the screw 11 and screw 24 to the base portion 14 of the connector body 3.

As mentioned above, the screw 24 is passed through the circuit board 5 and the base portion 14 of the connector body 3, and screwed into a threaded hole 39 formed in the face 36 of the cuboid block 8, to secure the circuit board 5 and the base portion 14 of the connector body 3.

As such, the cuboid block 8 has the function of attaching predetermined components at two locations by means of screw 24 and screw 11.

The screw 24' is passed, through holes provided on the base portion 14 of the connector body 3 and the circuit board 5 and secured by a nut or the like near the edge of the circuit board 5 opposite the side where the ejector 6 is attached.

After assembling the panel circuit board 1 of the present invention, the cuboid block 8 is positioned at a location where the base portion 14 of the connector body 3 is thin at one end of the circuit board 5. A hole portion 39 (common to FIG. 3 to FIG. 8) that is bored in the inward direction of the cuboid block 8 and threaded so as to fit with the screw 24 forming the turn axis portion is formed on the face 36 of the cuboid block 8 contacting the base portion 14 of the connector body 3 (see FIG. 3 and FIG. 7). When the cam portion 18 of the ejector 6 is disposed in a space portion 21 between the circuit board 5 and the base portion 14 of the connector body 3 as mentioned above, the through hole 25 of the circuit board 5, the through hole 26 of the base portion 14 of the connector body 3, the turn axis hole 16 of the ejector 6 and the hole 39 of the cuboid block 8 are positionally aligned so as to enable passage therethrough. Next, a tubular sleeve 40 is disposed inside the turn axis hole 16 of the ejector 6. Furthermore, the screw 24 is inserted in the through hole and connected by screwing into the hole portion 39 of the cuboid block 8. As a result, the circuit board 5 and the base portion 14 of the connector body 3 are secured.

Figure 11:
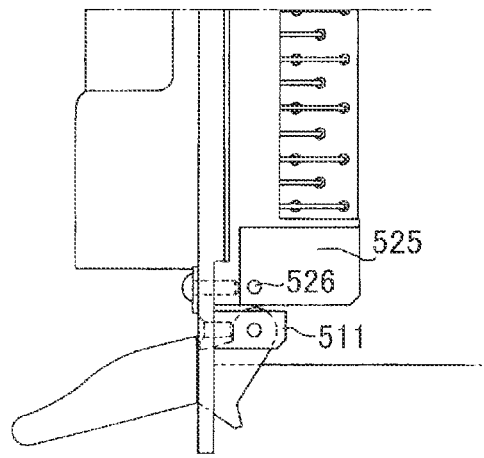
FIG. 11 A partially enlarged plan view of a conventional panel circuit board.
Figure 12:
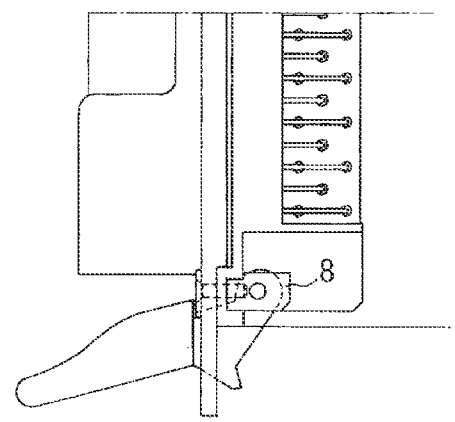
FIG. 12 A partially enlarged plan view of a panel circuit board according to the present invention.

FIG. 11 is a partially enlarged view of a conventional panel circuit board 51, and FIG. 12 is a partially enlarged view of a panel circuit board 1 of the present invention.

In FIG. 11, there are two attachment blocks 511 and 525, whereas in FIG. 12, there is only one block 8 and the attachment block 511 shown in FIG. 11 is omitted. In FIG. 12, the space cleared by the omission can be used to provide more electrical terminals 2.

In this way, the connector portion mounted on the panel circuit board 1 of the present invention has a turn axis portion (screw 24) of ejector 6 passed through a through hole in the base portion 14 of the connector body 3, providing the effects of enabling excessive space for attachment elements of the ejector 6 to be saved and reducing the number of components as compared to the conventional art, enabling effective use to be made of the space freed by the lack of attachment elements, such as by providing more connector terminals. As a result, the invention provides the effect of offering a connector that can be applied even to complicated circuit structures.

Since a tubular sleeve 40 enabling passage of the screw 24 is passed through the turn axis hole 16 of the ejector and the through hole 25 of the circuit board 5, and a space greater than the thickness of the cam portion is obtained in the space portion 21 between the circuit board 5 and the base portion 14 of the connector body 3, it can be turned about the screw 24 without being fixated to the ejector 6.

Embodiment 2

Embodiment 2 differs from Embodiment 1 in that the frame 4, panel 7, cuboid block 8, screw 11 and screw 24 are limited to conductive materials. In this case, as can be seen with reference to FIG. 3, like Embodiment 1, when assembly of the panel circuit board 1 has been completed, the frame 4 is electrically connected to the panel 7 by surface contact via the claw portion 15 or the tab 32, the tab 4 is electrically connected to the cuboid block 8 via the screw 11, and the cuboid block 8 is electrically connected to predetermined wires of the circuit board 5 through the screw 24 (turn axis portion of ejector). Additionally, if the screw head of the screw 24 is in contact with a ground line of the circuit board 5, then the frame 4 is electrically connected to the ground line of the circuit board 5.

As a result, when the connector portion shown in FIG. 1 is mated with a counterpart connector portion not shown in the drawings, the raised portions 37 formed on the frame 4 so as to project toward the opposite side will contact the frame of the counterpart connector which is not shown, so that the frames of the connectors will be electrically connected to each other.

Therefore, by providing an arrangement wherein the frame 4 is in electrical contact with the frame ground of the unit wiring rack or the grounded frame of the counterpart connector, it is possible to provide an electrically stable shielding effect.

Embodiment 3

Figure 4:
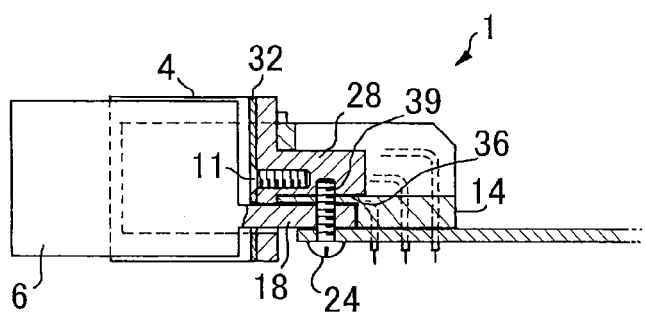
FIG. 4 A side view of the panel circuit board 1 of FIG. 1 from the ejector side, showing Embodiment 3 of the present invention.

Embodiment 3 differs from Embodiments 1 and 2 in that the panel 7 and cuboid block 8 in FIG. 3 are formed by integrally molding with a non-conductive or conductive material. FIG. 4 is a side view showing the arrangement of Embodiment 3, as seen from the ejector side of the panel circuit board 1 shown in FIG. 1. In FIG. 4, the integral portion 28 integrally formed from the panel 7 and the cuboid block 8 is indicated by the hatched portion.

Figure 8:
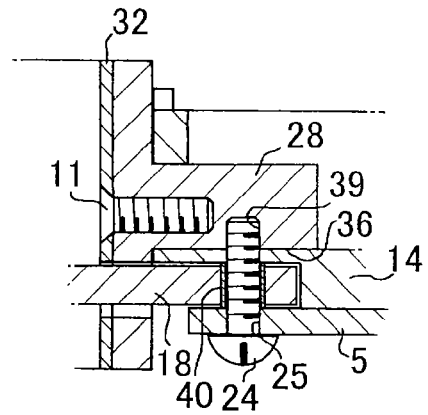
FIG. 8 An enlarged side view showing the details of the screw 11 and screw 24 screwed into the hatched portion 28 of FIG. 4.

FIG. 8 is an enlarged side view showing the details when the screw 11 and screw 24 are screwed into the hatched portion 28 of FIG. 4.

In Embodiment 3 as well, if the integral portion 28 is a conductive material, when assembly of the panel circuit board 1 has been completed, the frame 4 will be electrically connected to the integral portion 28 integrally formed from the panel 7 and the cuboid block 8 by a direct connection via the claw portion (not shown) of the frame 4 or by surface contact by means of the tab 32, whereby the integral portion 28 will be in electrical contact with predetermined wires in the circuit board 5 through the screw 24 (turn axis portion of ejector). When the screw head of the screw 24 is in contact with a ground line of the circuit board 5, the frame 4 will be electrically connected to the ground lines of the circuit board 5.

Additionally, when the connector portion shown in FIG. 1 is mated with a counterpart connector portion not shown in the drawings, the raised portions 37 formed on the frame 4 so as to project toward the opposite side will contact the frame of the counterpart connector, so that the frames of the connectors will be electrically connected to each other.

Therefore, in Embodiment 3, if the integral portion 28 is a conductive material, a connector portion mounted on a panel circuit board of the present invention will be able to achieve an electrically stable shielding effect if the frame 4 is brought into electrical contact with the frame ground of the unit wiring rack or a grounded frame of the counterpart connector.

Embodiment 4

Figure 5:
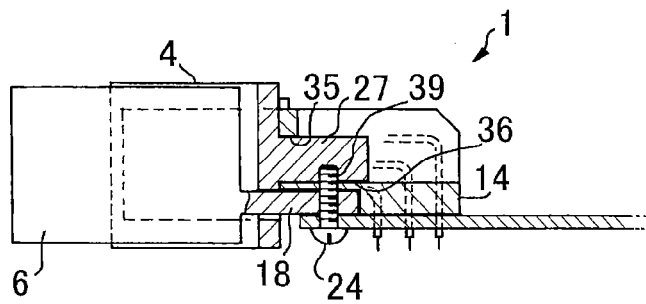
FIG. 5 A side view of the panel circuit board 1 of FIG. 1 from the ejector side, showing Embodiment 4 of the present invention.

In Embodiment 4, the integral portion 28 in FIG. 4 of Embodiment 3 is further formed by molding integrally with the frame 4 using a conductive material. FIG. 5 is a side view from the ejector side of the panel circuit board 1 shown in FIG. 1, showing the form of Embodiment 4. In FIG. 5, the integral portion 27 formed integrally from the frame 4, panel 7 and cuboid block 8 is indicated by the hatched portion, and the screw 11 shown in FIG. 4 is unneeded and therefore not shown.

Figure 9:
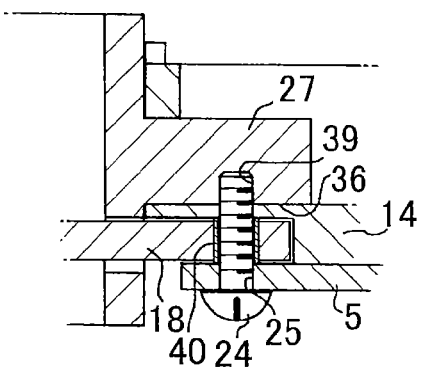
FIG. 9 An enlarged side view showing the details of the screw 24 screwed into the hatched portion 27 of FIG. 5.
Figure 10:
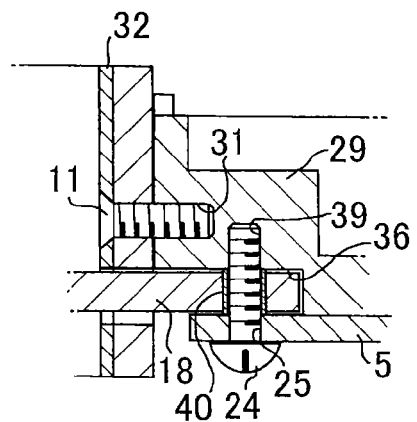
FIG. 10 An enlarged side view showing the details of the screw 11 and screw 24 screwed into the hatched portion 29 of FIG. 6.

FIG. 9 is an enlarged side view showing the details when the screw 24 is screwed into the hatched portion 27 of FIG. 5.

With this Embodiment 4, if the integral portion 27 is a conductive material, then upon assembly of the panel circuit board 1, the integral portion 27 comes into electrical contact with a predetermined wire of the circuit board 5 via the screw 24 (turn axis portion of the ejector). If the screw head of the screw 24 contacts a ground line in the circuit board 5, then the integral portion 27 is electrically connected to the ground line of the circuit board 5.

When the connector portion shown in FIG. 1 is mated with a counterpart connector portion that is not shown, then as mentioned above, raised portions 37 formed at parts of the integral portion 27 corresponding to the frame covering the housing portion will come into contact with the frame of the counterpart connector, and the frames of the connectors will become electrically connected.

Therefore, in Embodiment 4, if the integral portion 27 is a conductive material, then the connector portion mounted on the panel circuit board of the present invention will have an electrically stable shielding effect due to the part of the integral portion 27 corresponding to the frame electrically contacting the frame ground of the unit wiring rack or the grounded frame of the counterpart connector.

Additionally, even if the integral portion 27 is not a conductive material, two among the cuboid block 8, panel 7 and frame, and the screw 11 will be unneeded, enabling the number of assembled parts of the panel circuit board 1 to be reduced and offering a connector that can be easily assembled.

Embodiment 5

Figure 6:
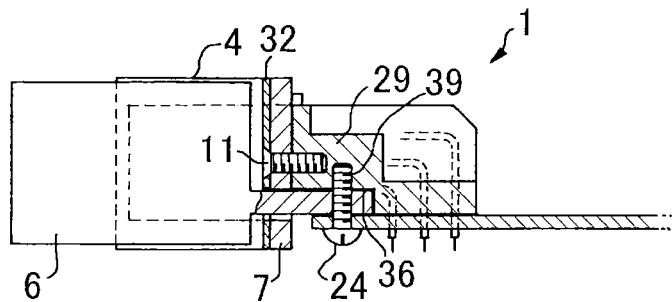
FIG. 6 A side view of the panel circuit board 1 of FIG. 1 from the ejector side, showing Embodiment 5 of the present invention.

Embodiment 5 differs from Embodiment 1 in that the cuboid block 8 and the base portion 14 of the connector body 3 in FIG. 3 are integrally molded from a non-conductive material such as a resin. FIG. 6 is a side view from the ejector 6 side of the panel circuit board 1 show in FIG. 1, showing the form of Embodiment 5. In FIG. 6, the integrally molded integral portion 29 is indicated by the hatched portion.

In Embodiment 5, as with Embodiment 1, the circuit board 5 is secured by a screw 24 in a threaded hole 39 in the bottom surface 36 of the integral portion 29, and the frame 4 and panel 7 are secured by a screw 11 in a threaded hole 31 in the side surface of the integral portion 29, so the integral portion 29 has the function of securing the components at two locations.

As such, in Embodiment 5, the block member 8 can be omitted due to the integral portion 29, so the number of components of the panel circuit board 1 can be reduced, and a connector that is easy to assemble can be offered.

Effects of the Invention

The connector mounted on the panel circuit board 1 of Embodiment 1 of the present invention has the base portion 14 of the connector body 3 and the circuit board 5 secured by means of a turn axis portion of the ejector 6, so the connector portion can be attached to the edge of a small space on a standardized small circuit board, as a result of which the effect of enabling adaptation to complicated circuit arrangements such as those supporting a large number of electrical terminals of connectors is achieved.

The connector mounted on the panel circuit board 1 of Embodiment 2, in addition to having the effects of Embodiment 1, has the frame 4, panel 7, cuboid block 8, spring 11 and spring 24 composed of a conductive material, so a frame 4 covering the housing portion 13 for housing the electrical terminals 2 can be electrically connected to the ground lines of the circuit wiring, as a result of which the connector of the present invention provides an electrically stable shielding effect.

The connector mounted on the panel circuit board of Embodiment 3, in addition to having the effects of Embodiment 1 and Embodiment 2, has a panel 7 and a cuboid block 8 integrally formed of a conductive material, so the number of components of either the panel 7 or the cuboid block 8 can be reduced, the number of components of the panel circuit board 1 can be reduced, and a connector that can be easily assembled can be provided.

The connector mounted on the panel circuit board of Embodiment 4, in addition to having the effects of Embodiment 1, Embodiment 2 and Embodiment 3, has a frame 4, panel 7 and cuboid block 8 that are integrally formed, so two of the frame, panel and cuboid block, and the screw 11 can be omitted, providing a connector that can be easily assembled.

The connector mounted on the panel circuit board of Embodiment 5, in addition to the effects of Example 1, has the base portion 14 of the connector body 3 and the cuboid block portion 8 integrally molded from a resin or the like, so the cuboid block 8 can be omitted and a connector that can be easily assembled can be obtained.

While embodiments of the present invention have been explained above by giving examples, the preset invention is not limited to the examples described above, and additions and modifications are possible within a scope not departing from the spirit of the present invention.

INDUSTRIAL APPLICABILITY

The invention can be applied to the technical field of small panel circuit boards inserted along the edges of circuit boards in a unit wiring rack.

DESCRIPTION OF THE REFERENCE NUMBERS 1 panel circuit board
2 electrical terminal
3 connector body
4 frame
5 circuit board
6 ejector
7 panel
8 cuboid block
11 screw
12 protrusion
13 housing portion
14 base portion
15 claw portion
16 turn axis hole
17 aperture portion
18 cam portion
19 aperture portion
20 turning knob
21 space portion
22 protrusion
24 screw
25 through hole of circuit board
26 through hole of base portion
27 integral portion
28 integral portion
29 integral portion
30 surface
31 hole
32 tab
33 through hole of tab
34 through hole of panel
35 through hole of base portion
36 bottom surface
37 raised portion
39 hole in cuboid block
40 tubular sleeve
51 panel circuit board of conventional art
52 electrical terminal
53 connector body portion
55 circuit board
56 ejector
57 panel
58 aperture portion
58' aperture portion
59 aperture portion
511 attachment member
513 housing portion
514 base portion
518 frame
520 screw
521 screw
523 turn axis hole
524 through hole
525 attachment member
526 through hole
529 cam portion

The invention claimed is:

1. A connector to be attached to a circuit board inserted into a receptacle, the connector comprising:
    a connector body having a housing portion for housing electrical terminals connected to predetermined wires in the circuit board, and a base portion next to said housing portion;
    a panel having an aperture portion formed inside a pair of opposing surfaces, through which said housing portion can be passed;
    a turn axis portion passing through said circuit board and said base portion;
    an ejector for ejecting said circuit board from an insertion state around the turn axis portion as an axis; and
    a connecting member connected to the turn axis portion for turning said ejector so as to secure said circuit board and said connector body.

2. The connector according to claim 1, wherein said connecting member is integrally molded with said panel using a conductive material.

3. The connector according to claim 1, further comprising a frame covering at least a portion of the housing portion of said connector body, wherein said frame, said panel and said connecting member are electrically connected to at least one wire of said circuit board through said turn axis portion.

4. The connector according to claim 1, wherein said connecting member is integrally molded with the base portion of said connector body.

5. The connector according to claim 3, wherein said connecting member further comprises a connecting portion contacting said panel which is between said frame and the connecting portion.

6. The connector according to claim 2, further comprising a frame covering at least a portion of the housing portion of said connector body, wherein said frame, said panel and said connecting member are electrically connected to at least one wire of said circuit board through said turn axis portion.

7. The connector according to claim 4, wherein said connecting member further comprises a connecting portion contacting said which is between said frame and the connecting portion.

8. The connector according to claim 6, wherein said connecting member further comprises a connecting portion contacting said panel which is between said frame and the connecting portion.

* * * * *